United States Patent
Lou et al.

(10) Patent No.: US 7,855,911 B2
(45) Date of Patent: Dec. 21, 2010

(54) RECONFIGURABLE MAGNETIC LOGIC DEVICE USING SPIN TORQUE

(75) Inventors: Xiaohua Lou, Bloomington, MN (US); Dimitar V. Dimitrov, Edina, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 154 days.

(21) Appl. No.: 12/126,014

(22) Filed: May 23, 2008

(65) Prior Publication Data

US 2009/0290408 A1 Nov. 26, 2009

(51) Int. Cl.
  G11C 11/00 (2006.01)
  G11C 5/08 (2006.01)
  G11C 7/02 (2006.01)
(52) U.S. Cl. .................. 365/158; 365/66; 365/171; 365/173; 365/209; 365/225.5
(58) Field of Classification Search .................. 365/66, 365/158, 171, 173, 209, 225.5
See application file for complete search history.

(56) References Cited

U.S. PATENT DOCUMENTS

| | | | |
|---|---|---|---|
| 6,542,000 B1 | 4/2003 | Black | |
| 6,744,086 B2 | 6/2004 | Daughton | |
| 6,774,391 B1 | 8/2004 | Cowburn | |
| 6,914,807 B2 | 7/2005 | Nakamura | |
| 7,110,284 B2 | 9/2006 | Hayakawa | |
| 7,224,601 B2 | 5/2007 | Panchula | |
| 7,233,039 B2 | 6/2007 | Huai | |
| 7,285,836 B2 * | 10/2007 | Ju et al. | 257/421 |
| 7,502,249 B1 | 3/2009 | Ding | |
| 7,539,047 B2 * | 5/2009 | Katti | 365/158 |
| 2005/0269612 A1 | 12/2005 | Torok | |
| 2006/0171199 A1 * | 8/2006 | Ju | 365/171 |
| 2007/0007609 A1 * | 1/2007 | Saito et al. | 257/421 |
| 2007/0047294 A1 | 3/2007 | Panchula | |
| 2007/0246787 A1 | 10/2007 | Wang | |
| 2008/0258247 A1 * | 10/2008 | Mancoff et al. | 257/421 |
| 2008/0277703 A1 * | 11/2008 | Iwayama | 257/295 |
| 2009/0040855 A1 | 2/2009 | Luo | |
| 2009/0185410 A1 | 7/2009 | Huai | |
| 2009/0218645 A1 * | 9/2009 | Ranjan et al. | 257/421 |

(Continued)

OTHER PUBLICATIONS

K. Miura et al., A Novel SPRAM (SPin-transfer-torque-RAM) with a Synthetic Ferrimagnetic Free Layer..., VLSI Symposium on VLSI Tech. Digest of Technical Papers (2007).

(Continued)

*Primary Examiner*—Ly D Pham
(74) *Attorney, Agent, or Firm*—Campbell Nelson Whipps LLC

(57) ABSTRACT

Spin torque magnetic logic devices that function as memory devices and that can be reconfigured or reprogrammed as desired. In some embodiments, the logic device is a single magnetic element, having a pinned layer, a free layer, and a barrier layer therebetween, or in other embodiments, the logic device has two magnetic elements in series. Two input currents can be applied through the element to configure or program the element. In use, logic input data, such as current, is passed through the programmed element, defining the resistance across the element and the resulting logic output. The magnetic logic device can be used for an all-function-in-one magnetic chip.

7 Claims, 3 Drawing Sheets

U.S. PATENT DOCUMENTS

2009/0296454 A1* 12/2009 Honda et al. ............... 365/158
2009/0310213 A1   12/2009 Hing
2010/0118600 A1*  5/2010 Nagase et al. .............. 365/158

OTHER PUBLICATIONS

A. Ney et al., Programmable Computing with a Single Magnetoresistance Element, Nature 425, 485 (2003).

L. Berger, Emission of Spin Waves bya Magnetic Multilayer Traversed by a Current, Phys. Rev. B 54, 9353 (1996).

W.C. Black, Jr. et al., Programmable Logic Using Giant-Magnetoresistance and Spin-Dependent Tunneling Devices (invited), J. Appl. Phys. 87, 6674 (2000).

H. Meng et al., A Spintronics Full Adder for Magnetic CPU, IEEE Elec. Dev. Lett. 26, 360 (2005).

R.P. Cowburn et al., Room Temperature Magnetic Quantum Cellular Automata, Science 287, 1466 (2000).

U.S. Appl. No. 12/125,975, filed May 23, 2008, Inventor: Haiwen Xi, Our Ref: 13866.00.

* cited by examiner

RECONFIGURABLE MAGNETIC LOGIC DEVICE USING SPIN TORQUE

BACKGROUND

This application relates to spin torque transfer devices.

Spin electronics has attracted much research and industrial interest in the last decade. In spin electronics, the spin of an electron, rather than the charge, is used to indicate the presence of digital information. The digital information or data, represented as a "0" or "1", is storable in the alignment of magnetic moments within a magnetic element and is represented as the resistive state of the magnetic element, which depends on the magnetic moment's alignment or orientation. The stored information or data is read from the element by detecting the magnetic element's resistive state. A more recent development of spin electronics is the spin transfer torque technology, which is a method to manipulate the electron spin and magnetic orientation of electronic devices and therefore the stored information.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. Such an element is generally referred to as a "spin tunneling junction," "magnetic tunnel junction" or the like. When the magnetization orientations of the free layer and pinned layer are parallel, the resistance of the element is low. When the magnetization orientations of the free layer and the pinned layer are antiparallel, the resistance of the element is high.

The magnetization orientation of the free layer is conventionally controlled by an external magnetic field. Recently-observed spin transfer torque effect shows that a DC current or current pulse through the magnetic element can also be used to manipulate the free layer magnetization orientation. Under a sufficiently large current, the free layer magnetization orientation stabilizes along the parallel direction with respect to the pinned layer magnetization orientation when electrons flow from the pinned layer to the free layer, vice versa. To read out the resistance of the magnetic element, a current-perpendicular-to-plane (CPP) configuration is used, in which a small current is driven perpendicular to the layers of the magnetic element. Because of the small size of the magnetic elements and the close spacing of adjacent elements, care must be taken that current applied to one magnetic element does not inadvertently affect an adjacent magnetic element.

At least because of their small size, it is desirous to use magnetic logic elements in many applications. It has been proposed that these spin electronic devices using magnetic fields could be used as logic devices. However, there are deficiencies in the proposed designs. Complex logic functions (such as an XOR function) can not be realized using the design of magnetic logic devices employing magnetic fields. The present disclosure provides improved programmable or reconfigurable magnetic logic device that utilize input current passed through magnetic elements.

BRIEF SUMMARY

The present disclosure relates to spin torque magnetic logic devices. In some embodiments, the logic device is a single magnetic element, having a pinned layer, a free layer, and a barrier layer therebetween. Two input currents can be applied through the element to configure or program the element. In use, logic input current is passed through the programmed element, defining the resistance across the element and the resulting logic output. The logic devices also function as memory devices and may be reprogrammed when desired without requiring hardware changes.

A first particular embodiment of this disclosure is a magnetic logic device having a magnetic tunnel junction element comprising a pinned layer, a free layer and a barrier layer therebetween, the free layer magnetization orientation switchable by spin torque. Through the magnetic tunnel junction element is an electrical path for a first logic input current and a second logic input current. A resistance sensing circuit is electrically connected to the magnetic tunnel junction element to detect the resistance (logic output) across the element. In some embodiments, the logic device is an AND gate. In other embodiments, the logic device is an OR gate.

A second particular embodiment of this disclosure is a magnetic logic device having a first magnetic tunnel junction element comprising a ferromagnetic pinned layer, a ferromagnetic free layer, and a non-magnetic barrier layer therebetween, and a second magnetic tunnel junction element connected in series to the first magnetic tunnel junction element with a spacer layer therebetween, the second element comprising a second ferromagnetic pinned layer, a second ferromagnetic free layer, and a second non-magnetic barrier layer therebetween. The free layers have a magnetization orientation switchable by spin torque. The device includes a first input current path and a second input current path into and through the first and second magnetic tunnel junction elements that provide a flow of electrons through the first magnetic tunnel junction element and the second magnetic tunnel junction element. Also included is a resistance sensing circuit electrically connected to the first magnetic tunnel junction element and the second magnetic tunnel junction element. This magnetic logic device is suitable for complex logic functions. In some embodiments, the magnetic logic device is a NAND gate, having the first free layer antiparallel to the first pinned layer, the second free layer antiparallel to the second pinned layer, and the first pinned layer parallel to the second pinned layer. In other embodiments, the magnetic logic device is an XOR gate, having the first free layer antiparallel to the first pinned layer, the second free layer parallel to the second pinned layer, and the first pinned layer parallel to the second pinned layer.

A third particular embodiment of this disclosure is a magnetic logic device comprising a first magnetic logic element and a second magnetic logic element, and a non-magnetic spacer layer therebetween, each magnetic logic element comprising a ferromagnetic pinned layer, a ferromagnetic free layer and a non-magnetic barrier layer therebetween, each of the free layers having a magnetization orientation. Also present is an input system that defines the magnetization orientations of the free layers in accordance with a combination of a first input data and a second input data, and an output sensing system that reads an output data. The input data may be current, such as DC current. The output data may be resistance.

A fourth particular embodiment of this disclosure is a method for programming a magnetic logic device by providing a magnetic logic device having first and second magnetic logic elements, orienting the magnetization orientation of the free layers of the elements by passing a first input current and a second input current through the magnetic logic device to form a programmed logic device, and reading the output data and, based on the input currents, to determine a logic function of the device. The reading of the output data may be with a current less than a critical current of the free layers. In some embodiments, orienting the magnetization orientation of the free layers is done by passing a first input current and a second input current through the magnetic logic device so that the pinned layer and the free layer of the first magnetic logic element are antiparallel and the pinned layer and the free layer of the second magnetic logic element are antiparallel, to form a NAND logic device. In some other embodiments, the orienting of the magnetization orientation of the free layers is done by passing a first input current and a second input current through the magnetic logic device so that the pinned layer and the free layer of the first magnetic logic element are antiparallel and the pinned layer and the free layer of the second magnetic logic element are parallel, to form an XOR logic device. In some embodiments, after reading the output data, a reprogrammed logic device can be made by reorienting the magnetization orientation of the free layers by passing a third input current and a fourth input current through the magnetic logic device.

These and various other features and advantages will be apparent from the following detailed description.

BRIEF DESCRIPTION OF THE DRAWINGS

The invention may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

All scientific and technical terms used herein have meanings commonly used in the art unless otherwise specified. The definitions provided herein are to facilitate understanding of certain terms used frequently herein and are not meant to limit the scope of the present disclosure.

Figure 1:
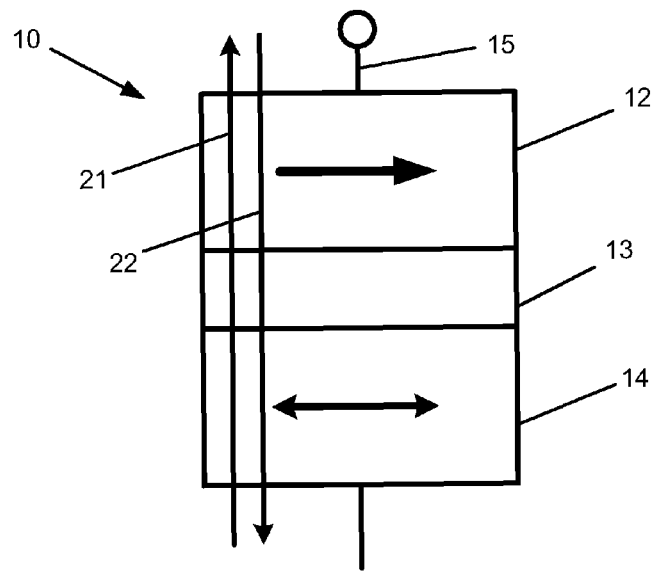
FIG. 1 is a schematic diagram of a first embodiment of a logic device according to the present disclosure.

Referring to FIG. 1, an embodiment of a magnetic logic device 10 is diagrammatically illustrated. Although not illustrated herein, logic device 10 is formed on a substrate. Logic device 10 includes a ferromagnetic pinned layer 12, a ferromagnetic free layer 14, and a non-magnetic tunnel barrier layer 13 between pinned layer 12 and free layer 14. Each of pinned layer 12 and free layer 14 has a magnetic orientation or magnetization orientation associated therewith, indicated by the arrow orientation; in FIG. 1, pinned layer 12 has a designated magnetization orientation, whereas free layer 14 is illustrated as having a non-designated magnetization orientation. Pinned layer 12 may be pinned by an antiferromagnetic layer or may be a fixed layer without pinning but with a high coercivity to stabilize itself Pinned layer 12 could be replaced by a synthetic antiferromagnetic (SAF) coupled structure, i.e., two ferromagnetic sublayers separated by a metallic spacer, such as Ru or Cu, with the magnetization orientations of the sublayers in opposite directions. Tunnel barrier layer 13 may be a non-magnetic metallic material or a non-magnetic metal oxide material. Note that other layers, such as seed or capping layers, or electrodes adjacent layers 12, 14, are not depicted for clarity, as are bit lines and word lines.

Logic device 10 is configured to receive input via a first electric current 21 and a second electric current 22 passing therethrough. In this embodiment, for this discussion, programming or input current flowing through device 10 in a downward direction (as current 22 is illustrated), has electrons flowing upward, and is defined as binary data bit "0"; programming current flowing through device 10 in an upward direction (as current 21 is illustrated) has electrons flowing downward, and is defined as binary data bit "1". It should be understood that current 21, 22 passes through device 10 for a very short time, and that current 21, 22 could be referred to as a current pulse or even a voltage pulse. Further, the direction of currents 21, 22 is illustrated in FIG. 1 merely as an example of orientation, and is not intended to define the magnetization orientation of free layer 14.

Figure 1A:
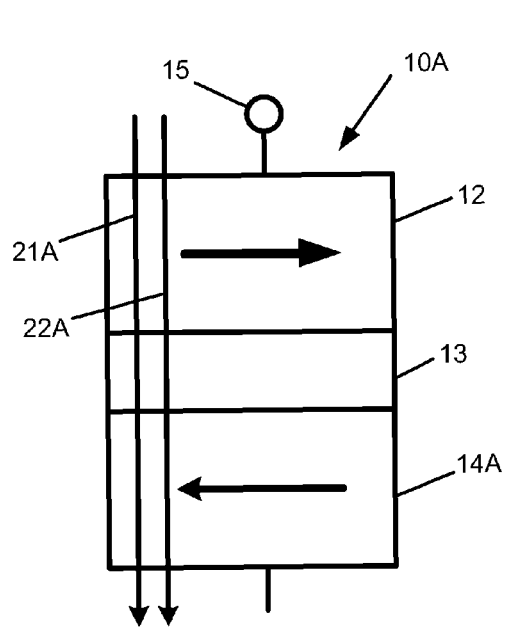
FIGS. 1A and 1B are schematic diagrams of the logic device of FIG. 1, having been programmed.
Figure 1B:
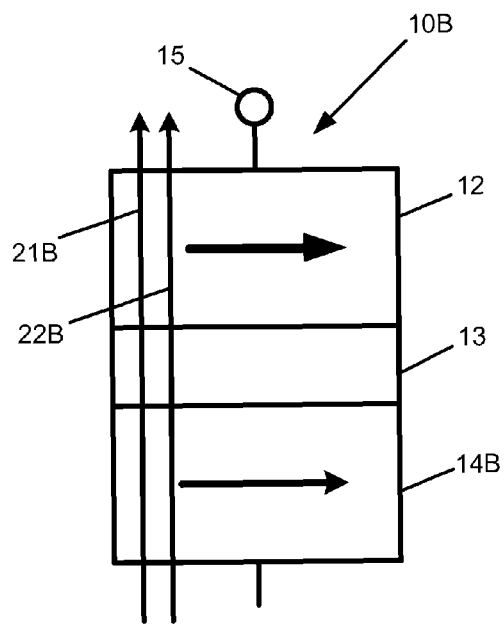

FIGS. 1A and 1B illustrate the programming of logic device 10 by defining the magnetization orientation of free layer 14 by currents 21, 22 applied to device 10. In FIG. 1A, both currents 21A, 22A pass down through logic device 10A; the total input current is "00". Due to both currents 21A, 22A passing in the direction of pinned layer 12 to free layer 14A, the resulting magnetization orientation of free layer 14A is antiparallel to the orientation of pinned layer 12. These initial currents 21A, 22A program device 10A as an AND gate, as will be described below. FIG. 1B, both currents 21B, 22B pass up through logic device 10B; the total input current is "11". Due to both currents 21B, 22B passing in the direction of free layer 14 to pinned layer 12, the resulting magnetization orientation of free layer 14B is parallel to the orientation of pinned layer 12. These initial currents 21B, 22B program device 10B as an OR gate, as will be described below.

After being programmed, logic input currents can be applied to logic devices 10A, 10B to obtain a logic output. For both programmed devices 10A, 10B, logic input current 21A, 21B and logic input current 22A, 22B should be applied simultaneously (i.e., logic input 21A and logic input 22A are applied simultaneous to produce device 10A, and logic input 21B and logic input 22B are applied simultaneous to produce device 10B). If not applied simultaneously, the prior programmed state of device 10A, 10B may be altered. To better avoid undesired altering of the programmed states, the amplitude of each of the input currents can be maintained below the critical current level (i.e., the current needed to switch the free layer), so that only the combination of the two input currents can switch the free layer.

Based on the logic input currents into programmed device 10A, 10B, the logic output is defined by the resistance across device 10A, 10B. Since magnetic tunneling of electrons through tunnel barrier layer 13 contributes the majority of the resistance across magnetic element 10A, 10B, the resistance of element 10A, 10B is determined, in large part, by the magnetization orientation of pinned layer 12 and free layer 14A, 14B. A resistance sensing circuit 15 is operably coupled across device 10A, 10B to measure the resistance. Because pinned layer 12 has its magnetization orientation fixed, change in the magnetization orientation of free layer 14A, 14B will change the resistance and the logic output of device 10A, 10B. It is well established that when the magnetization orientations of the free layer and pinned layer are parallel, the output resistance across the element is low ($R_L$); for this discussion, the low resistance is defined as output binary data bit "1". When the magnetization orientations of the free layer and the pinned layer are antiparallel, the output resistance of the element is high ($R_H$); for this discussion, the high resistance is defined as output binary data bit "0".

As mentioned above, programmed device 10A is an AND gate. In use, two bits of data, as input current using the definitions of above, are applied to programmed device 10A. The input levels and output for the four possible configurations are summarized below in Table 1. The four configurations of inputs and output define the logic device as an AND gate.

TABLE 1

| Input Data 21A | Input Data 22A | Free Layer 14A | Output Data |
|---|---|---|---|
| 0 | 0 | No switch | 0 |
| 0 | 1 | No switch | 0 |
| 1 | 0 | No switch | 0 |
| 1 | 1 | Switch | 1 |

As mentioned above, programmed device 10B is an OR gate. In use, two bits of data, as input current using the definitions of above, are applied to programmed device 10B. The input levels and output for the four possible configurations are summarized below in Table 2. The four configurations of inputs and output define the logic device as an OR gate.

TABLE 2

| Input Data 21B | Input Data 22B | Free Layer 14B | Output Data |
|---|---|---|---|
| 0 | 0 | Switch | 0 |
| 0 | 1 | No switch | 1 |
| 1 | 0 | No switch | 1 |
| 1 | 1 | No switch | 1 |

Either or both programmed devices 10A, 10B can be reprogrammed or reconfigured at a later time by applying current inputs to obtain the desired configuration. One method to reprogram devices 10A, 10B is to apply an input current above the critical current level (i.e., the current needed to switch free layer 14A, 14B).

Figure 2:
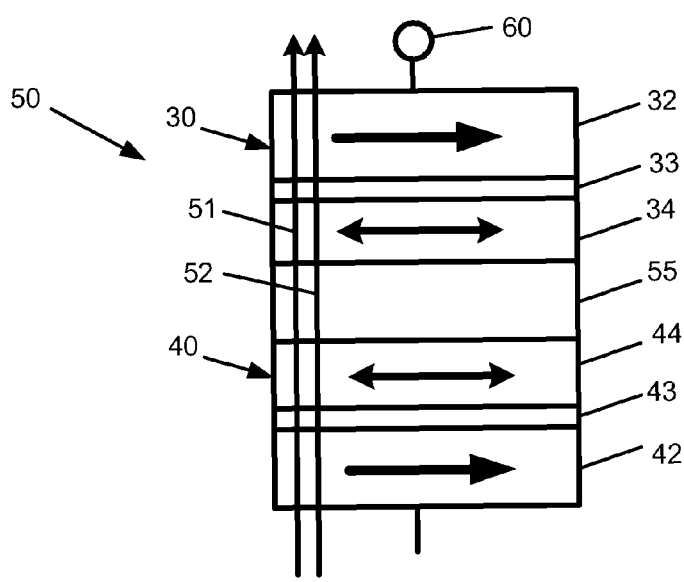
FIG. 2 is a schematic diagram of a second embodiment of a logic device according to the present disclosure.

Another embodiment of a magnetic logic device in accordance with this disclosure is illustrated in FIG. 2. Logic device 10, discussed above, is composed of a single magnetic logic element (having a pinned layer, a free layer and a tunnel barrier layer) through which two currents are passed. Logic device 50 of FIG. 2 is composed of two magnetic logic elements in series.

Logic device 50 is composed of a first magnetic element 30 and a second magnetic element 40. A resistance sensing circuit 60 is operably coupled across device 50 to measure the resistance. First element 30 includes a ferromagnetic pinned layer 32, a ferromagnetic free layer 34, and a non-magnetic tunnel barrier layer 33 between pinned layer 32 and free layer 34. Similarly, second element 40 includes a ferromagnetic pinned layer 42, a ferromagnetic free layer 44, and a non-magnetic tunnel barrier layer 43 between pinned layer 42 and free layer 44. Positioned between first element 30 and second element 40, specifically between free layer 34 and free layer 44, is a spacer layer 55.

Each of pinned layers 32, 42 and free layers 34, 44 has a magnetic orientation or magnetization orientation associated therewith. In FIG. 2, pinned layers 32, 42 both have a designated magnetization orientation, whereas free layers 34, 44 are illustrated as having a non-designated magnetization orientation. Tunnel barrier layers 33, 43 may be non-magnetic metallic material or non-magnetic metal oxide material. Spacer layer 55 can be a non-magnetic, metallic layer (e.g., Cu) and is sufficiently thick to isolate elements 30, 40 so that first element 30 and second element 40 function independently of one another. That is, the magnetization orientation of free layer 34 does not affect and is not affected by the magnetization orientation of free layer 44. Note that other layers, such as seed or capping layers, or electrodes adjacent layers 32, 42, are not depicted for clarity.

In this embodiment, logic device 50 is configured to receive a first programming current 51 and a second programming current 52 passing therethrough. In this embodiment, both currents 51, 52 flow upward, so that the electrons flow downward. In this discussion, when a current (either current 51, 52) is "off", the input is defined as binary data bit "0", and current "on" is input defined as binary data bit "1". The "on" status of currents 51, 52 in FIG. 2 is merely as an example, and is not intended to define the magnetization orientation of free layers 34, 44.

For discussion herein, the coercive fields of free layers 34, 44 are different, resulting in a difference in the critical switching current for elements 30, 40. A hard free layer (e.g., free layer 34) has a higher switching current ($I_H$) than a soft free layer (e.g., free layer 44), which has a smaller switching current ($I_S$). The amplitude of each of programming currents 51, 52 ($I_{input}$) satisfies Max $\{I_S, \frac{1}{2} I_H\} < I_{input} < I_H$ where Max $\{I_S, \frac{1}{2} I_H\}$ is the larger of $I_S$ and $\frac{1}{2} I_H$. In this manner, a single input current can only switch the soft free layer, and the sum of two input currents is needed to switch the hard free layer.

As described above in reference to logic device 10, when the magnetization orientations of the free layer and pinned layer are parallel, the output resistance across the element is low ($R_L$); for this discussion, the low resistance is defined as "0". When the magnetization orientations of the free layer and the pinned layer are antiparallel, the output resistance of the element is high ($R_H$); for this discussion, the high resistance is defined as "1".

Returning to the figures, FIGS. 2A through 2D illustrate the programming of logic device 50 of FIG. 2 by defining the magnetization orientation of free layers 34, 44 due to input currents 51, 52 applied to device 50. The various elements and layers of device 50 are not illustrated in FIGS. 2A through 2D, but are understood to be as those illustrated in FIG. 2.

Figure 2A:
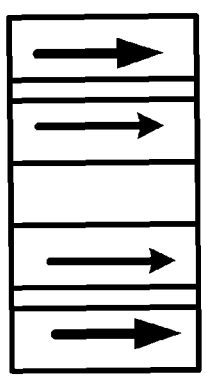
FIGS. 2A through 2D are representations of various magnetization orientations of the logic device of FIG. 2.
Figure 2B:
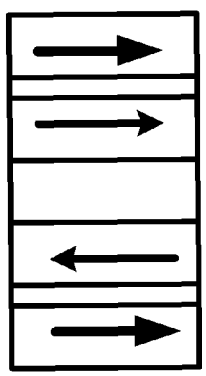
Figure 2C:
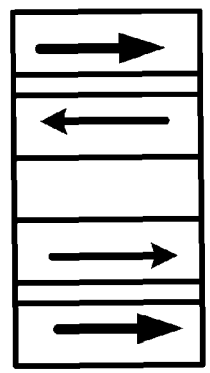
Figure 2D:
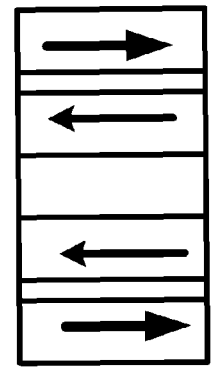

In FIG. 2A, element 30 has parallel magnetization orientations, which is $R_L$, and element 40 has parallel magnetization orientations, $R_L$. In FIG. 2B, element 30 has parallel magnetization orientations, which is $R_L$, and element 40 has antiparallel magnetization orientations, $R_H$. In FIG. 2C, element 30 has antiparallel magnetization orientations, which is $R_H$, and element 40 has parallel magnetization orientations, $R_L$. In FIG. 2D, element 30 has antiparallel magnetization orientations, which is $R_H$, and element 40 has antiparallel magnetization orientations, $R_H$. The resistance of FIG. 2A is the lowest and the resistance of FIG. 2D is the highest. For this discussion, the lowest and middle resistance levels (FIGS. 2A, 2B, and 2C) are defined as "0" and the highest resistance level (FIG. 2D) is defined as "1".

Figure 3:
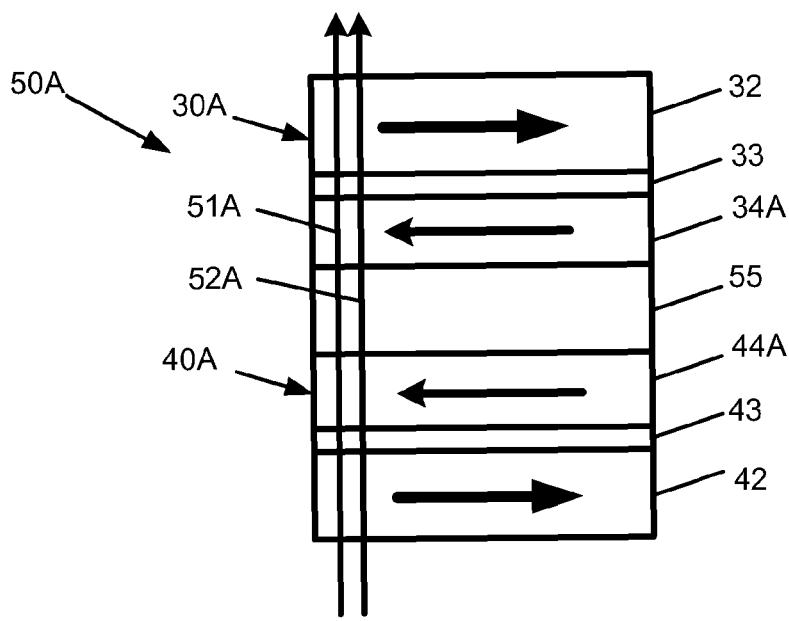
FIG. 3 is a schematic diagram of a third embodiment of a logic device according to the present disclosure, in particular, a NAND gate.

FIG. 3 illustrates device 50 programmed as device 50A, at the highest resistance level (FIG. 2D). In use, two bits of data, as input current using the definitions of above, can be applied to device 50A. The input levels and output for the four possible configurations are summarized below in Table 3. These four configurations of inputs and output define logic device 50A as a NAND gate.

TABLE 3

| Input Data 51A | Input Data 52A | Free Layers | Output Data |
|---|---|---|---|
| 0 | 0 | No switch | 1 |
| 0 | 1 | No switch | 1 |
| 1 | 0 | No switch | 1 |
| 1 | 1 | Switch hard layer 34A | 0 |

When both inputs are "0" (i.e., no input current applied), no free layers switch their magnetization orientation, and device 50A remains as it is. When the input is "01" or "10", sufficient input current is applied to switch soft layer 44A of element 40A, but not hard layer 34A. However, because of the direction of input of input currents 51, 52 through element 40A, first through pinned layer 42 and then through free layer 44A, the desired orientation is antiparallel. Thus, free layer 44A does not switch from its programmed magnetization orientation. When the input "11" is applied, sufficient input current is applied to switch hard free layer 34A of element 30 and soft free layer 44A of element 40A. Because the direction of current input into element 30A is first through free layer 34A then to pinned layer 32, free layer 34A desires parallel orientation, and hard free layer 34A switches. However, because of the direction of current input through element 40A, the desired orientation is antiparallel. Thus, soft free layer 44A does not switch from its programmed magnetization orientation.

Figure 4:
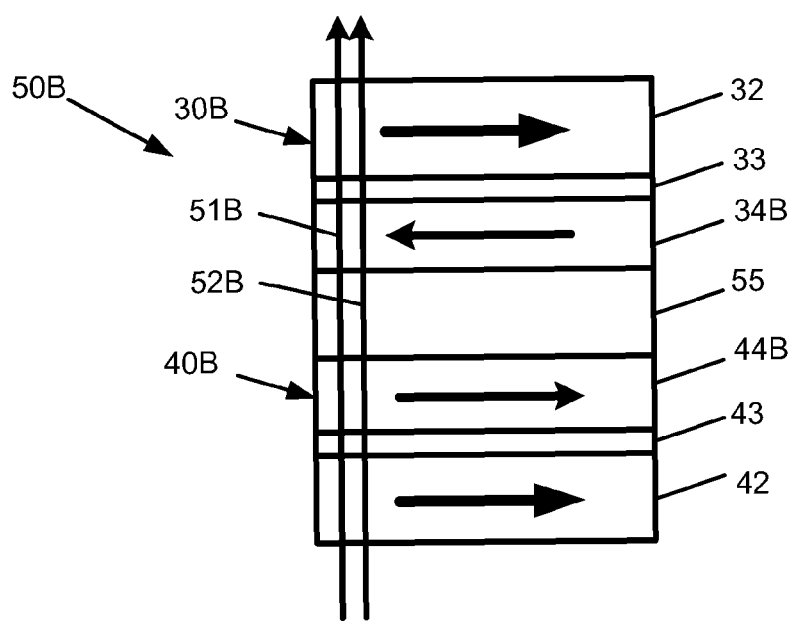
FIG. 4 is a schematic diagram of a fourth embodiment of a logic device according to the present disclosure, in particular, an XOR gate.

FIG. 4 illustrates device 50 programmed as device 50B, at the highest low resistance level (FIG. 2C). In use, two bits of data, as input current using the definitions of above, can be applied to device 50B. The input levels and output for the four possible configurations are summarized below in Table 4. These four configurations of inputs and output define logic device 50B as an XOR gate.

TABLE 4

| Input Data 51B | Input Data 52B | Free Layers | Output Data |
|---|---|---|---|
| 0 | 0 | No switch | 0 |
| 0 | 1 | Switch soft layer 44B | 1 |
| 1 | 0 | Switch soft layer 44B | 1 |
| 1 | 1 | Switch soft layer 44B and hard layer 34B | 0 |

When both inputs are "0", no free layers switch their magnetization orientation, and device 50B remains as it is. When the input is "01" or "10", sufficient input current is applied to switch soft layer 44B of element 40B, but not hard layer 34B. Because of the direction of current input through element 40B, first through pinned layer 42 and then through free layer 44A, the desired orientation is antiparallel. Thus, free layer 44B switches from its programmed magnetization orientation. When the input "11" is applied, sufficient input current is applied to switch hard free layer 34B of element 30B and soft free layer 44B of element 40B. Because the direction of current input into element 30B is first through free layer 34B then to pinned layer 32, free layer 34B desires parallel orientation, and hard free layer 34B switches. Similarly, because of the direction of current input through element 40B, the desired orientation is antiparallel, and soft free layer 44B switches from its programmed magnetization orientation.

Programmed device 50A of FIG. 3 and programmed device 50B of FIG. 4 also function as a controlled-NOT (CNOT) gate. When first input current 51A, 51B is "1" (on), the output will always be the opposite of the second input current 52A, 52B.

Devices 50A, 50B described above can be programmed and reprogrammed as described above in respect to devices 10A, 10B. These general devices 10, 50 have numerous advantages for enhancing integrated device density. For example, multiple functions can be performed by devices 10, 50; devices 10, 50 can function both as memory and a reconfigurable logic device. Also, by using spin torque switching of magnetization orientations, the processing time for devices 10, 50 is on the order of a nanosecond, providing fast response time. Further, due to the non-volatility of the magnetic devices, devices 10, 50 can retain information without extra needed power, which dramatically decreases power consumption.

Because each individual magnetic device (of above) can process information as a logic device and store information as a non-volatile memory unit, the multiple functions of the magnetic logic device (i.e., non-volatile memory and logic) can be incorporated into a single magnetic chip. For example, a system chip utilizing a magnetic logic device described above can have the computations structure and memory structure all in the same system chip. The traditional hard drive, memory, and CPU can be combined into a single, all-function-in-one system chip. Having such an all-function-in-one chip utilizing a plurality of magnetic logic devices reduces data communication time within a computing system, between the CPU, memory, and hard drive. Further, due to the non-volatility of the magnetic devices, a single, all-function-in-one magnetic chip can function and retain information using low power consumption.

Various configurations for magnetic logic elements and systems utilizing those elements have been discussed above. Thus, numerous embodiments of the RECONFIGURABLE MAGNETIC LOGIC DEVICE USING SPIN TORQUE are disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A reconfigurable magnetic logic device comprising:
a first magnetic logic element and a second magnetic logic element, and a non-magnetic spacer layer therebetween, each magnetic logic element comprising a ferromagnetic pinned layer, a ferromagnetic free layer and a non-magnetic barrier layer therebetween, each of the free layers having a magnetization orientation;
an input system that defines the magnetization orientations of the free layers in accordance with a combination of a first input current and a second input current, wherein the first and second input current pass through the reconfigurable magnetic logic device; and
an output sensing system that reads an output data wherein the free layer of the first magnetic logic element and the free layer of the second magnetic logic element have different coercive fields.

2. The magnetic logic device of claim 1, wherein the first and second input currents are DC currents or current pulses.

3. The magnetic logic device of claim 1, wherein the output data is resistance.

4. A reconfigurable magnetic logic device comprising:

a first magnetic logic element and a second magnetic logic element, and a non-magnetic spacer layer therebetween, each magnetic logic element comprising a ferromagnetic pinned layer, a ferromagnetic free layer and a non-magnetic barrier layer therebetween, each of the free layers having a magnetization orientation;

an input system that defines the magnetization orientations of the free layers in accordance with a combination of a first input current and a second input current, wherein the first and second input current pass through the reconfigurable magnetic logic device; and an output sensing system that reads an output data wherein the free layer of the first magnetic logic element is a hard free layer and the free layer of the second magnetic logic element is a soft free layer.

5. The magnetic logic device of claim 4, wherein either the first or second input current can switch the soft free layer and both the first and second input currents are needed to switch the hard free layer.

6. The magnetic logic device of claim 4, wherein the first and second input currents are DC currents or current pulses.

7. The magnetic logic device of claim 4, wherein the output data is resistance.

* * * * *